United States Patent
Manasterski et al.

(10) Patent No.: US 11,208,715 B2
(45) Date of Patent: Dec. 28, 2021

(54) METHOD FOR DECORATING A TIMEPIECE COMPONENT

(71) Applicant: The Swatch Group Research and Development Ltd, Marin (CH)

(72) Inventors: Christian Manasterski, Le Landeron (CH); Cedric Faure, Cortaillod (CH); Simon Springer, Bern (CH); Gerard Rossier, La Chaux-de-Fonds (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 15/452,759

(22) Filed: Mar. 8, 2017

(65) Prior Publication Data

US 2017/0268111 A1      Sep. 21, 2017

(30) Foreign Application Priority Data

Mar. 16, 2016     (EP) .................... 16160659

(51) Int. Cl.
*C23C 14/02* (2006.01)
*C23C 14/14* (2006.01)
(Continued)

(52) U.S. Cl.
CPC ............ *C23C 14/028* (2013.01); *C23C 14/14* (2013.01); *C23C 14/165* (2013.01); *C23C 14/34* (2013.01);
(Continued)

(58) Field of Classification Search
CPC ....... C23C 14/028; C23C 14/14; C23C 14/56; C23C 14/34; C23C 14/165; C23C 28/021;
(Continued)

(56) References Cited

U.S. PATENT DOCUMENTS

| 4,252,862 A | 2/1981 | Nishida |
| 4,415,421 A | 11/1983 | Sasanuma |

(Continued)

FOREIGN PATENT DOCUMENTS

| CH | 705 653 B1 | 4/2013 |
| EP | 0 603 673 A1 | 6/1994 |

(Continued)

OTHER PUBLICATIONS

Machine Translation EP 2434031 A1 (Year: 2012).*

(Continued)

*Primary Examiner* — Michael A Band
(74) *Attorney, Agent, or Firm* — Oblon, McClelland, Maier & Neustadt, L.L.P.

(57) ABSTRACT

The invention relates to a method for decorating a timepiece component comprising:
  a) a step of preparation of the timepiece component optionally comprising a first step of depositing a first material on the timepiece component to form a first sub-layer,
  b) a second step of depositing a second material on the timepiece component obtained in step a) to form a second sub-layer,
  c) a colouring step comprising the deposition of a third coloured material on the timepiece component obtained in step b) to form a coloured external decorative layer,
According to the invention, at least step b) and step c) are achieved by a physical vapour deposition method.

14 Claims, 1 Drawing Sheet

(51) Int. Cl.
  *C23C 14/16* (2006.01)
  *C23C 14/56* (2006.01)
  *C23C 14/58* (2006.01)
  *C23C 28/02* (2006.01)
  *C25D 7/00* (2006.01)
  *G04B 13/02* (2006.01)
  *G04B 19/04* (2006.01)
  *G04B 19/06* (2006.01)
  *G04B 29/02* (2006.01)
  *G04B 37/22* (2006.01)
  *G04B 47/04* (2006.01)
  *G04D 3/00* (2006.01)
  *C23C 14/34* (2006.01)

(52) U.S. Cl.
  CPC .......... *C23C 14/56* (2013.01); *C23C 14/5873* (2013.01); *C23C 28/021* (2013.01); *C25D 7/005* (2013.01); *G04B 13/026* (2013.01); *G04B 19/042* (2013.01); *G04B 19/06* (2013.01); *G04B 29/027* (2013.01); *G04B 37/223* (2013.01); *G04B 47/04* (2013.01); *G04D 3/0092* (2013.01); *G04D 3/0097* (2013.01)

(58) Field of Classification Search
  CPC ............. C23C 14/5873; C23C 14/588; G04D 3/0092; G04D 3/0097; G04D 3/0025; C25D 7/005; G04B 37/223; G04B 47/04; G04B 19/042; G04B 19/06; G04B 45/00; G04B 45/0015; G04B 19/10; B24B 9/16; B24B 9/168
  See application file for complete search history.

(56) References Cited

U.S. PATENT DOCUMENTS

| 4,791,017 A | 12/1988 | Hofmann et al. |
| 5,510,012 A | 4/1996 | Schulz et al. |
| 5,985,469 A | 11/1999 | Kurakata et al. |
| 2011/0123815 A1 | 5/2011 | Kawakami et al. |
| 2014/0305164 A1* | 10/2014 | Lauper ................. A44C 27/003 63/34 |

FOREIGN PATENT DOCUMENTS

| EP | 2 434 031 A1 | 3/2012 | |
| GB | 2129835 A * | 5/1984 | ........... C23C 14/042 |
| JP | 53-23811 A | 3/1978 | |
| JP | 10206560 A * | 8/1998 | |
| JP | 2007101271 A * | 4/2007 | |
| JP | 2014069308 A * | 4/2014 | |

OTHER PUBLICATIONS

Machine Translation JP 2007101271 A (Year: 2007).*
Machine Translation JP 10206560 A (Year: 1998).*
European Search Report dated Oct. 6, 2016 in European Application 16160659.5 filed on Mar. 16, 2016 (with English Translation of Categories of Cited Documents).
Combined Chinese Office Action and Search Report dated Aug. 31, 2020 in corresponding Chinese Patent Application No. 201710153767.1 (with English Translation and English Translation of Category of Cited Documents), 15 pages.

* cited by examiner

METHOD FOR DECORATING A TIMEPIECE COMPONENT

This application claims priority from European Patent application 16160659.5 of Mar. 16, 2016, the entire disclosure of which is hereby incorporated herein by reference.

FIELD OF THE INVENTION

The invention concerns a method for decorating a timepiece component comprising a step of preparation of the timepiece component, a corrosion protection step, and a colouring step for forming a coloured external decorative layer.

BACKGROUND OF THE INVENTION

Such a method is conventionally used to make timepiece components, more particularly hands and appliques, and especially brass hands and appliques.

According to this method, the timepiece component is prepared by depositing a first protective layer by electrodeposition on all the faces of the timepiece component. This technique has the advantage of being able to pre-treat large quantities of components at a relatively high rate. The component is then subjected to a mechanical diamond polishing operation which, by forming facets, gives the component a bright sparkling appearance. The component is then treated again by electrodepositing on all the surfaces of the component a corrosion protection layer, and a coloured external decorative layer. These electrodepositing operations are complex this time because of the delicate surfaces obtained after diamond machining. Consequently, the colour of the external decorative layer may sometimes exhibit heterogeneity which results in the component being scrapped. Further, with this electrodeposition technique, production costs are high and not all alloys can be deposited to obtain all possible colours.

SUMMARY OF THE INVENTION

It is an object of the invention to overcome these different drawbacks.

More specifically, it is an objective of the invention to propose a method for the industrial decoration of timepiece components, which is simple to implement and rationalized to reduce production costs.

It is another object of the invention to propose a method for the industrial decoration of timepiece components that reduces the scrap or waste rate.

The present invention therefore concerns a method for decorating a timepiece component comprising:
 a) a step of preparation of the timepiece component optionally comprising a first step of depositing a first material on the timepiece component to form a first sub-layer,
 b) a second step of depositing a second material on the timepiece component obtained in preparation step a) to form a second sub-layer,
 c) a colouring step comprising the deposition of a third coloured material on the timepiece component obtained in the second deposition step b) to form a coloured external decorative layer.

According to the invention, at least the second deposition step b) and the colouring step c) are achieved by a physical vapour deposition method (PVD).

Advantageously, the first deposition step in preparation step a) may also be achieved by a physical vapour deposition method.

According to a preferred embodiment of the invention, at least the second deposition step b) and the colouring step c), and optionally the first deposition step in preparation step a), are achieved without breaking vacuum conditions.

The method according to the invention thus rationalizes the implementation of its various steps. Further, it makes it possible to obtain a coloured external decorative layer of great homogeneity, and therefore decreases the scrap rate of the timepiece components.

BRIEF DESCRIPTION OF THE DRAWINGS

Other features and advantages of the invention will appear more clearly upon reading the following description of an embodiment of the invention, given simply by way of illustrative and non-limiting example, and the annexed Figures, among which.

DETAILED DESCRIPTION OF A PREFERRED EMBODIMENT

Figure 1:
FIGS. 1 to 5 show a cross-sectional view of a timepiece component treated in the different steps of the method according to the invention.

Referring to FIG. 1, there is shown a cross-sectional view of an untreated timepiece component 1, for example a hand, particularly a brass or bronze hand.

The timepiece component may, for example, be chosen from the group comprising hands, appliques, dials, flanges, bezels, crowns, push-buttons, oscillating weights, wheels, bridges, plates, or any other element or member used in a timepiece which it is wished to colour.

Figure 2:
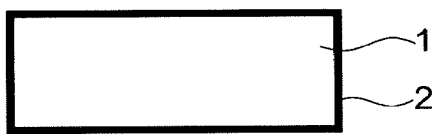

Timepiece component 1 is first prepared in preparation step a) of the method of the invention. This preparation step may comprise, for example, optionally, a first step of depositing a first material on timepiece component 1 to form a first sub-layer 2, as shown in FIG. 2. Preferably, first sub-layer 2 covers all the surfaces of timepiece component 1. This first sub-layer 2 may be deposited by electrodeposition in a manner known to those skilled in the art. A PVD deposition may also advantageously be used, as will be seen below.

Figure 3:
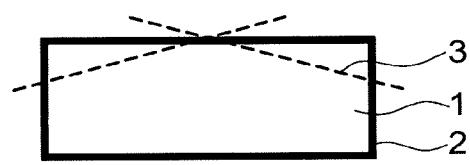
Figure 4:
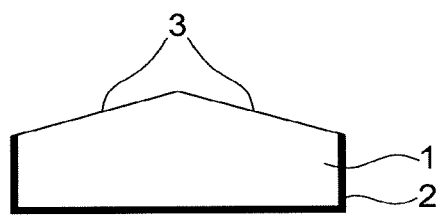
Figure 5:
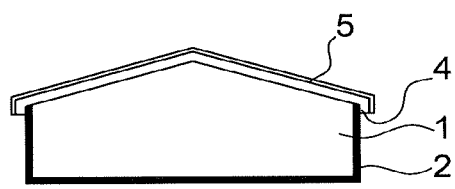

The first sub-layer 2 forms, in particular, a protective sub-layer, which is necessary when preparation step a) comprises a diamond polishing step. This step consists in forming on the surface of timepiece component 1 that will be visible from outside the timepiece, bevelled surfaces or facets 3 using a diamond tool, as shown in FIG. 3. This mechanical treatment gives timepiece component 1 a bright sparkling appearance. After diamond polishing, first sub-layer 2 has been removed from the top of timepiece component 1, as shown in FIG. 4. Other operations similar to diamond polishing may also be possible (satin finishing, sunray brushing, brushing or brightening.

First sub-layer 2 also promotes the adhesion of the other layers to be placed on timepiece component 1.

Preparation step a) may also comprise a step of cleaning the timepiece component 1 obtained after diamond polishing. In a manner known to those skilled in the art, the cleaning step may be achieved, for example, by chemical degreasing followed by rinsing with tap water and demineralised water. Component 1 is then dried and is ready for implementation of the second deposition step b).

Said second deposition step b) comprises the deposition of a second material on timepiece component 1 obtained in preparation step a) to form a second sub-layer 4. This second sub-layer 4 forms in particular, a second corrosion protection sub-layer. It also promotes the adhesion of decorative layer 5 to timepiece component 1. The colour of this second sub-layer 4 may advantageously be chosen to be close to the colour of decorative layer 5 to avoid a visible contrast if said decorative layer 5 suffers wear.

Then, in colouring step c), a third coloured material is deposited on timepiece component 1 obtained in second deposition step b) to form a coloured external decorative layer 5.

According to the invention, at least second deposition step b) and colouring step c) are achieved by a physical vapour deposition method (PVD).

The timepiece components decorated according to the method of the invention comprise an external decorative layer 5 with a particularly homogeneous colour, so that the scrap rate is very low.

In a particularly advantageous manner, second sub-layer 4 and decorative layer 5 are only deposited on the diamond polished surfaces 3 and on the sides of the timepiece component. It is, however, possible to provide, during colouring step c), a step of turning over the component or the use of equipment allowing PVD deposition on both sides of the timepiece component, if it is also wished for second sub-layer 4 and decorative layer 5 to be present on the back of the component.

Preferably, the first deposition step in step a) is also achieved by a physical vapour deposition method instead of electrodeposition.

According to a particularly preferred embodiment, the physical vapour deposition method may be a cathodic sputtering method. The sputtering gas is inert, typically argon. The PVD deposition parameters are determined by those skilled in the art to meet the colour and quality criteria required for the selected function and/or model.

The method according to the invention may also comprise, before implementation of the second deposition step b), an ion activation step. The ion activation parameters are determined by those skilled in the art. Ion activation ensures the perfect adherence of second sub-layer 4 deposited directly on diamond polished surfaces 3 of timepiece component 1 which were stripped during the diamond polishing operation.

In a particularly preferred manner, at least second deposition step b) and colouring step c), and optionally the first deposition step in preparation step a), are achieved without breaking vacuum conditions, in the same facility, which allows for simple and economical industrial implementation of the method of the invention.

Advantageously, the first material is chosen such that first sub-layer 2 protects timepiece component 1 and/or promotes the adhesion of second sub-layer 4 and of coloured external decorative layer 5. Likewise, the second material is chosen such that second sub-layer 4 protects timepiece component 1 from corrosion and/or promotes the adhesion of coloured external decorative layer 5. Preferably, at least the second material is a corrosion preventive material.

Preferably, the first material and/or the second material may be chosen from the group comprising nickel, chromium, stainless steel, tin, precious metals, and alloys thereof (for example an alloy of Cr/Ni (for example Inconel), Sn/Ni or Pd/Ni).

The first material and/or the second material may comprise nickel, in a quantity comprised between 0 wt % and 100 wt %.

In particular, the first material may be nickel.

According to another embodiment, the first and/or the second material may be an alloy of chromium and nickel, containing chromium in a quantity comprised between 20 wt % and 80 wt %, and preferably between 30 wt % and 70 wt %.

If the method is achieved without breaking vacuum conditions, the first material is preferably identical to the second material, which further rationalizes the method.

Preferably, second sub-layer 4 may have a thickness comprised between 200 nm and 1500 nm.

More generally, the composition and thickness of second sub-layer 4 are adapted to the nature of the material of timepiece component 1 and of the third material.

Advantageously, the third coloured material may be chosen from the group comprising precious metals and their alloys, or materials that are intrinsically stable over time, such as aluminium, and alloys thereof, and ceramics. The ceramic may be coloured, such as titanium nitride, or transparent to reveal the colour of the second sub-layer.

In particular, the third coloured material may be chosen from the group comprising gold, silver, palladium, platinum, rhodium and their alloys.

In a particularly advantageous manner, the third coloured material is an 18 k 5 N gold alloy, or nickel free and cobalt free 18.5 k gold alloy comprising between 75 wt % and 77.5 wt % gold, between 1.2 wt % and 1.6 wt % palladium and between 20.1 wt % and 23.8 wt % copper. CH Patent 705653, the content of which is incorporated by reference in the present Patent Application, describes such a solid alloy as having improved discolouration features.

This alloy is particularly preferred for the application of the coloured external decorative layer by PVD since it provides a decorative layer, which, in addition to having a homogeneous colour and a constant fineness with respect to the fineness of the third material, has better resistance to discolouration and tarnishing than that of a layer obtained from the same alloy deposited by electrodeposition. Further, the corrosion resistance of the decorative layer obtained according to the method of the invention is greater than that of the solid alloy.

Preferably, the coloured external decorative layer 5 has a thickness comprised between 100 nm and 1500 nm.

The method of the invention makes possible the industrial production of timepiece components exhibiting a high quality coloured decorative layer, deposited in a reliable and repeatable manner. Further, it makes it possible to use numerous alloys having numerous colours to make very varied coloured decorative layers.

The following example illustrates the present invention without thereby limiting its scope.

EXAMPLE

Hands cut from brass are coated with a first sub-layer 2 of nickel by electrodeposition and are diamond polished. The hands are then cleaned with detergent.

The hands thus prepared are then aligned on a substrate-holder of a commercially available PVD/sputtering machine. They are spaced apart to allow the passage of plasma.

The PVD treatment is then carried out. There is no heating phase so as not to deform the hands.

Following ion activation of the hands, the second nickel and chromium based sub-layer 4 and then the gold alloy decorative layer 5 are deposited under argon. The gold alloy is the nickel free and cobalt free 18.5 k alloy comprising between 75 wt % and 77.5 wt % gold, between 1.2 wt % and 1.6 wt % palladium and between 20.1 wt % and 23.8 wt % copper described in CH Patent 705653. The PVD parameters are chosen so as to deposit a 1 μm nickel and chromium based second sub-layer 4 and a 0.5 μm gold alloy decorative layer 5.

The hands treated according to the method of the invention have a very homogeneous colour so that the scrap rate is regularly less than 1%.

By way of comparison, hands in which the coloured external decorative layer is made from the same 18.5 k gold alloy described in CH Patent 705653, are treated in a similar manner to the invention, but in a method wherein the second deposition step b) is achieved by electrodeposition and the colouring step c) is achieved by PVD. These hands typically have a waste rate higher than 5%.

Also by way of comparison, hands in which the coloured external decorative layer is made from 18 k 5 N gold and which are treated in a similar way to the invention, but with method using only electrodeposition (including for steps b) and c)), have a waste rate higher than 5%.

What is claimed is:

1. A method for decorating a timepiece component comprising:
    preparing the timepiece component comprising depositing a first material on the timepiece component to form a first sub-layer that covers at least a top surface and one or more side surfaces of the timepiece component;
    polishing the timepiece component to thereby remove the first sub-layer from the top surface to form one or more bevelled surfaces;
    depositing a second material on the timepiece component obtained from the polishing of the timepiece to form a second sub-layer that covers and is in direct physical contact with the one or more bevelled surfaces, such that all of the surfaces of the timepiece component contact one of the first material or the second material; and
    colouring comprising depositing a third coloured material on the timepiece component obtained in the depositing of the second material to form a coloured external decorative layer,
    wherein at least the depositing of the second material and the colouring are achieved by a physical vapour deposition method (PVD),
    wherein the first material and/or the second material is an alloy of nickel and chromium, a quantity of chromium being comprised between 20 wt % and 80 wt %,
    wherein the physical vapour deposition method is a cathodic sputtering method, and
    wherein the polishing comprises diamond polishing.

2. The method according to claim 1, wherein the first material is chosen such that the first sub-layer protects the timepiece component and/or promotes adhesion of the second sub-layer and of the coloured external decorative layer.

3. The method according to claim 1, wherein the second material is chosen such that the second sub-layer protects the timepiece component from corrosion and/or promotes adhesion of the coloured external decorative layer.

4. The method according to claim 1, wherein the second material is chosen such that a colour of the second sub-layer is close to a colour of the coloured external decorative layer.

5. The method according to claim 1, wherein the first material and/or the second material is chosen from a group comprising stainless steel, tin, gold, silver, palladium, platinum, rhodium, and alloys thereof.

6. The method according to claim 5, wherein the first material and/or the second material is the alloy of nickel and chromium, the quantity of chromium being comprised between 30 wt % and 70 wt %.

7. The method according to claim 1, wherein the second sub-layer has a thickness comprised between 200 mm and 1500 mm.

8. The method according to claim 1, wherein the third coloured material is chosen from a group comprising gold, silver, palladium, platinum, rhodium and alloys thereof, aluminum and alloys thereof, and ceramics.

9. The method according to claim 8, wherein the third coloured material is chosen from a group comprising gold, silver, palladium, platinum, rhodium and alloys thereof.

10. The method according to claim 9, wherein the third coloured material is a nickel free and cobalt free gold alloy containing between 75 wt % and 77.5 wt % gold, between 1.2 wt % and 1.6 wt % palladium and between 20.1 wt % and 23.8 wt % copper.

11. The method according to claim 1, wherein the coloured external decorative layer has a thickness comprised between 100 nm and 1500 mm.

12. The method according to claim 1, wherein at least the depositing of the second material and the colouring, and the depositing of the first material in the preparing, are achieved without breaking vacuum conditions.

13. The method according to claim 1, wherein the timepiece component is chosen from a group comprising hands, appliques, dials, flanges, bezels, crowns, push-buttons, oscillating weights, wheels, plates and bridges.

14. The method according to claim 1, wherein the second sub-layer is formed on each of the one or more bevelled surfaces where the first sub-layer was removed and is formed on a portion of the first sub-layer.

* * * * *